United States Patent
Shrotriya

[19]
[11] Patent Number: 6,068,729
[45] Date of Patent: May 30, 2000

[54] TWO STEP PROCESS FOR CLEANING A SUBSTRATE PROCESSING CHAMBER

[75] Inventor: Ashish V. Shrotriya, Santa Clara, Calif.

[73] Assignee: Applied Materials, Inc., Santa Clara, Calif.

[21] Appl. No.: 09/145,923

[22] Filed: Sep. 3, 1998

Related U.S. Application Data

[62] Division of application No. 08/811,079, Mar. 3, 1997.

[51] Int. Cl.$^7$ .............................. C23C 16/00; C23F 1/02
[52] U.S. Cl. ...................... 156/345; 118/723 R; 134/1.1
[58] Field of Search ...................... 134/1.1, 21; 156/345; 216/67; 438/710, 714, 905, 906, 963; 118/723 R

[56] References Cited

U.S. PATENT DOCUMENTS

| | | | |
|---|---|---|---|
| 4,529,474 | 7/1985 | Fujiyama et al. | 156/643 |
| 4,855,047 | 8/1989 | Ury et al. | 156/345 |
| 4,874,947 | 10/1989 | Wang et al. | 156/643 |
| 5,158,644 | 10/1992 | Cheung et al. | 156/643 |
| 5,207,836 | 5/1993 | Chang | 134/1 |
| 5,281,302 | 1/1994 | Gabric et al. | 156/643 |
| 5,288,662 | 2/1994 | Lagendijk et al. | 437/239 |
| 5,356,478 | 10/1994 | Chen et al. | 134/1 |
| 5,417,826 | 5/1995 | Blalock | 204/176 |
| 5,434,109 | 7/1995 | Geissler et al. | 437/239 |
| 5,536,330 | 7/1996 | Chen et al. | 134/21 |
| 5,620,526 | 4/1997 | Watatani et al. | 134/1.1 |
| 5,817,578 | 10/1998 | Ogawa | 438/714 |
| 5,926,743 | 7/1999 | Xi et al. | 438/905 |

*Primary Examiner*—Thi Dang
*Assistant Examiner*—Luz Alejandro
*Attorney, Agent, or Firm*—Townsend & Townsend & Crew

[57] ABSTRACT

A method and apparatus for removing particles from an interior surface of a processing chamber using a two-step cleaning process. The method includes introducing a first cleaning process gas into the processing chamber, applying energy to that first cleaning process gas to remove particles from the processing chamber's interior surface, and introducing a second cleaning process gas into the processing chamber to remove a cleaning residue formed by a reaction between the first cleaning process gas and the processing chamber's interior surface. Removing or gettering the cleaning residue from the chamber wall improves the quality of the wafers formed in the process.

15 Claims, 4 Drawing Sheets

TWO STEP PROCESS FOR CLEANING A SUBSTRATE PROCESSING CHAMBER

CROSS-REFERENCE TO RELATED APPLICATIONS

This application is related to commonly assigned, co-pending patent application entitled "METHODS AND APPARATUS FOR GETTERING FLUORINE FROM CHAMBER MATERIAL SURFACES," having Li-Qun Xia, Visweswaren Sivaramakrishnan, Srinivas Nemani, Ellie Yinh, and Gary Fong listed as co-inventors, the complete disclosure of which is incorporated herein by reference.

BACKGROUND OF THE INVENTION

The present invention relates to the cleaning of a substrate processing system. More specifically, the present invention relates to methods and apparatus for removing cleaning residues, created during substrate processing, from the interior surfaces of a processing chamber.

High-density integrated circuits, commonly termed VLSI devices, are typically formed on semiconductor substrates by subjecting the substrates to a number of processing steps. These steps include operations such as deposition, etching, sputtering and diffusion. In the production of a finished substrate, each of these operations serves a function such as applying, patterning and manipulating the characteristics of the various layers employed in the given technology.

One of the primary steps in fabricating modern semiconductor devices is forming a dielectric layer on a semiconductor substrate. As is well known, such a dielectric layer can be deposited by chemical vapor deposition (CVD). In a conventional thermal CVD process, reactive gases are supplied to the substrate surface where heat-induced chemical reactions (homogeneous or heterogeneous) take place to produce a desired film. In a conventional plasma process, a controlled plasma is formed to decompose and/or energize reactive species to produce the desired film. In general, reaction rates in thermal and plasma processes may be controlled by controlling one or more of the following: temperature, pressure, and reactant gas flow rate.

An important way to improve quality and overall efficiency in fabricating devices is to clean the chamber effectively and economically. With growing pressures on manufacturers to improve processing quality and overall efficiency, eliminating the total down-time in a multiple-step process without compromising the quality of the wafers has become increasingly important for saving both time and money. During processing, reactive gases released inside the processing chamber form layers such as silicon oxides or nitrides on the surface of a substrate being processed. Undesirable oxide deposition occurs elsewhere in the CVD apparatus, such as in the area between the gas mixing box and gas distribution manifold. Undesired oxide residues also may be deposited in or around the exhaust channel and the walls of the processing chamber during such processes. Over time, failure to clean the residue from the CVD apparatus often results in degraded, unreliable processes and defective substrates. Without frequent cleaning procedures, impurities from the residue built up in the CVD apparatus can migrate onto the substrate. The problem of impurities causing damage to the devices on the substrate is of particular concern with today's increasingly small device dimensions. Thus, CVD system maintenance is important for the smooth operation of substrate processing, as well as resulting in improved device yield and better product performance.

Frequently, periodic chamber cleanings between processing of every N wafers is desired to improve CVD system performance in producing high quality devices. Providing an efficient, non-damaging clean of the chamber and/or substrate is often able to enhance performance and quality of the devices produced. Two methods of cleaning a processing chamber are in situ cleaning (also known as dry-etch cleaning) and wet cleaning. In an in-situ cleaning operation, process gases are evacuated from the processing chamber and one or more cleaning process gases are introduced. Energy is then applied to promote a reaction between the gases and any residues which may have accumulated on the processing chamber's interior surfaces. Residues on the processing chamber's interior react with the cleaning process gases, forming gaseous by-products which are then exhausted from the processing chamber, along with unreacted portions of the cleaning process gases. The cleaning process is followed by the resumption of normal processing.

In contrast to an in situ cleaning procedure, in which the processing chamber remains sealed, a wet cleaning procedure is performed by breaking the processing chamber's vacuum seal and manually wiping down the chamber's interior surfaces. A wet cleaning procedure is normally performed to remove residues which are not entirely removed by the in situ cleaning process, and thus slowly accumulate over time. A solvent is sometimes used to dissolve these residues. Once cleaned, the processing chamber is sealed and normal processing is resumed.

Unfortunately, such cleaning operations affect a substrate processing system's throughput in a variety of ways. For example, system throughput is reduced by the time involved in performing cleaning operations. In an in situ cleaning process, time is spent evacuating process gases from, and introducing/evacuating the cleaning process gases into/from the processing chamber. Flow rates, radio frequency (RF) power levels, temperature, pressure, and other cleaning process conditions must also be reset to desired levels after the cleaning process is completed. When a wet clean is performed, opening the processing chamber and physically wiping the chamber's interior surfaces results in even more down-time because the process must subsequently be re-stabilized. It is thus desirable to reduce the frequency with which such cleaning operations are performed.

Additionally, frequent cleaning operations tend to increase wear on the processing chamber components. For example, in-situ cleaning is typically performed using fluoridated carbons (e.g., $CF_4$, $C_2F_6$ and the like) or similar fluorine-containing gases (e.g., $NF_3$ and the like) due to their highly reactive nature. Unfortunately, exposure to plasmas created from such gases often causes the deterioration of processing chamber components. This increased wear can lead to component failure, thereby causing extended downtime, and adversely affecting processing system throughput.

The use of reactive gases in cleaning process chambers, however, also suffers from a further disadvantage. The same radicals which provide desirable cleaning characteristics may themselves cause the formation of residues. For example, the use of such gases can cause the accumulation of polymer residues, which also exhibit undesirable qualities. The addition of oxygen to the cleaning process gas may reduce the formation of such polymer residues. In particular, ozone or an oxygen/ozone mixture may provide the desired reduction in polymer formation while speeding the cleaning process, due to ozone's greater reactivity.

Another example of residues generated by cleaning gases are the cleaning residues often formed by the use of fluoridated compounds in certain cleaning processes. These compounds may react with the aluminum or anodized aluminum which makes up many of the standard processing chamber's components to form an aluminum fluoride residue on the interior surfaces of the chamber and the chamber's components. The reaction between the aluminum and the fluorine containing compounds often occurs because the residues within the processing chamber vary in thickness and therefore have different cleaning times. Thus, certain areas of the processing chamber's interior may become residue-free (i.e., exposed) before others, resulting in the formation of an aluminum fluoride residue on the exposed portions of the chamber's interior.

What is needed, therefore, are improved methods and apparatus for cleaning semiconductor process chambers. In particular, the cleaning methods and apparatus should be capable of removing the residues created during substrate processing operations, while reducing or eliminating the subsequent formation of cleaning residues such as polymers and aluminum fluoride.

SUMMARY OF THE INVENTION

The present invention is directed to methods and apparatus for cleaning the processing chamber of a substrate processing system used in processing operations such as the deposition and/or etching of substrates. In addition to removing residues formed during substrate processing, the methods and apparatus of the present invention remove or getter cleaning residues which may be formed from the reaction of cleaning gases with the components and the walls of the processing system.

The present invention provides a method for removing particles from an interior of a processing chamber using a two-step cleaning process. The method includes introducing a first cleaning gas into the processing chamber that includes ozone and a fluorine containing compound and applying energy to that first cleaning gas to remove deposition residue from the processing chamber's interior. The method further includes introducing a second cleaning gas into the processing chamber to remove a cleaning residue formed by a reaction between the first cleaning gas and the processing chamber's interior. Removing or gettering the cleaning residue from the chamber provides a number of advantages. For example, in a preferred embodiment of the present invention, fluorine radicals are delivered into the processing chamber to remove deposition residue, such as silicon oxide, by forming a silicon-fluoride gas product which is pumped out of the chamber. After the fluorine-based chamber cleaning procedure, any adsorbed fluorine on the surface of the chamber walls which might otherwise interact with, or be incorporated into, the deposited film on the next wafer to be processed is gettered by the method of the present invention.

In a specific configuration, particles on the interior surfaces of a processing chamber are removed by performing an in situ cleaning process. These particles may be deposited, for example, during processing operations such as deposition and etching, and often include compounds such as oxides and nitrides of silicon. The first cleaning gas will include ozone and a fluorine-containing compound. Ozone reduces the formation of polymer residues and increases the speed of the cleaning process due to its relatively high reactivity. Pure ozone may be used, or an oxygen/ozone mixture may be employed to deliver the ozone to the processing chamber. Compounds containing fluorine which may be used in the present invention include compounds such as $CF_4$, $C_2F_6$, $NF_3$ and the like. Energy is then applied to promote a reaction between the particles and the first cleaning process gas. For example, a plasma may be formed from the first cleaning gas. Alternatively, thermal energy may be used to foster the reaction. The energized cleaning gases react with the material to be removed, forming gaseous by-products which are then evacuated from the processing chamber.

After the deposition residue has been substantially removed from the processing chamber, the second cleaning gas is introduced into the processing chamber while again applying energy to the gaseous mixture in the processing chamber. This second cleaning gas may include compounds such as $C_2F_6$, $N_2$ and the like. This second cleaning step is performed to remove any cleaning residues from the processing chamber's interior in which the preceding cleaning phase may have created, such as aluminum fluoride or hydrocarbons. The second cleaning step also helps passivate the processing chamber's interior surfaces, thus reducing the formation of residues. The gaseous by-products generated from the reaction between the cleaning residues and the second cleaning gas are then evacuated from the processing chamber.

In an exemplary embodiment, the first and second cleaning gases are the same gases. After the deposition residue has been substantially removed from the chamber, the power applied to the chamber is lowered to remove the cleaning residue. In one example, a $C_2F_6$ gas is introduced into the chamber, and about 700 to 2000 Watts of RF power is applied to form a plasma within the chamber that reacts with the deposition residues. The reactants are evacuated from the chamber, and the power level is reduced to about 400 to 600 Watts. At this reduced power level, the $C_2F_6$ has sufficiently reduced reactivity to minimize reactions with the chamber walls, thereby minimizing the generation of residual cleaning residues, such as AlF. The $C_2F_6$ will have sufficient reactivity at this reduced power level to react with the AlF that has already been formed at the higher power levels. The gas reactants are evacuated from the chamber to remove these cleaning residues from the vapor deposition apparatus.

A further understanding of the nature and advantages of the present invention may be realized by reference to the remaining portions of the specification and the drawings.

DETAILED DESCRIPTION OF THE PREFERRED EMBODIMENTS

I. An Exemplary CVD System

Figure 1A:
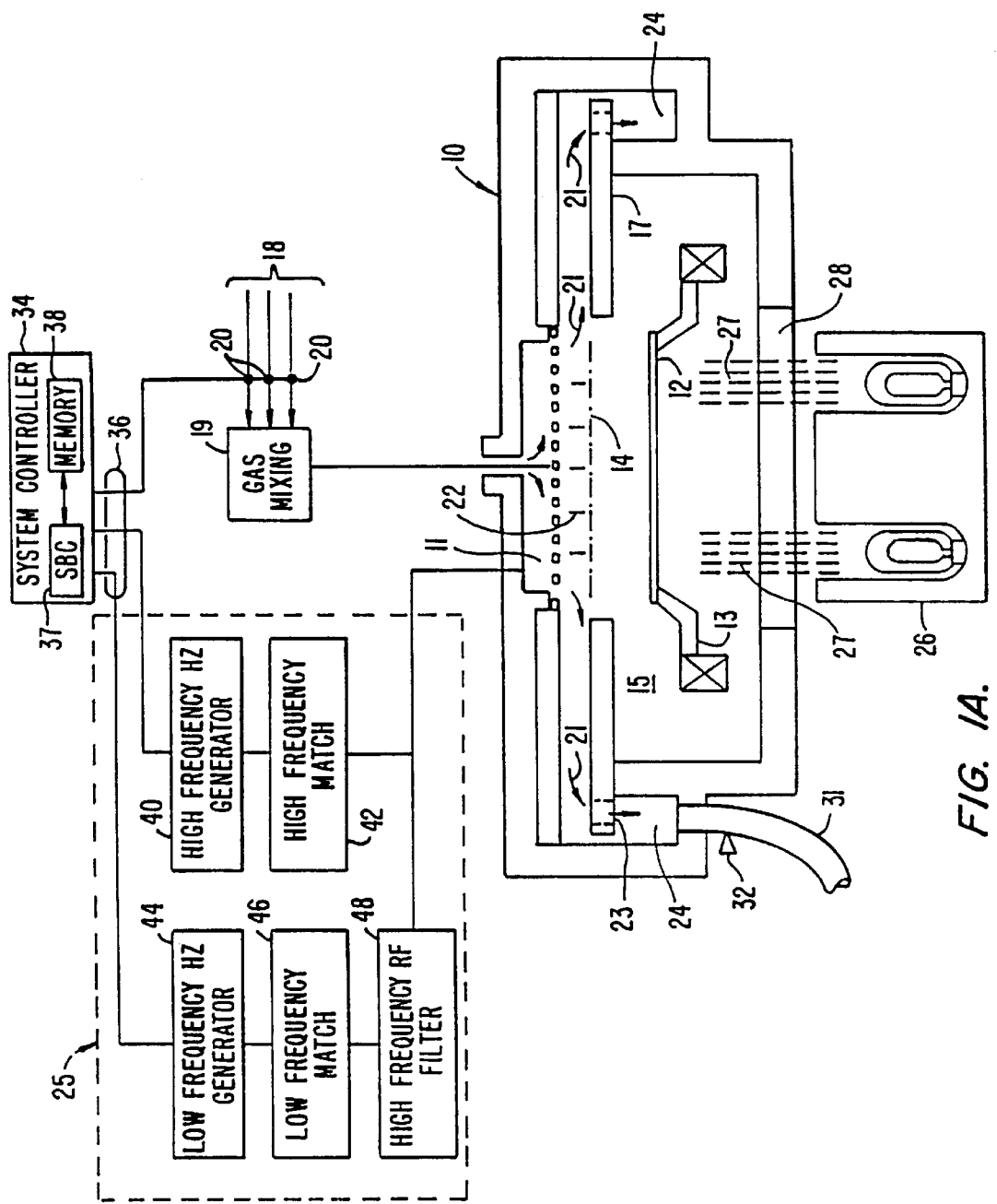
FIG. 1A is a vertical, cross-sectional view of one embodiment of a chemical vapor deposition (CVD) apparatus used for depositing a film according to the present invention.

FIG. 1A illustrates one embodiment of a parallel-plate plasma enhanced chemical vapor deposition (PECVD) system 10 having a vacuum chamber 15 in which a cleaning operation according to the method of the present invention may be practiced. The illustration of PECVD system 10 is simplified for purposes of this discussion. CVD system 10 contains a gas distribution manifold 11 for dispersing process gases through perforated holes in manifold 11 to a substrate (not shown) that rests on a susceptor 12. Susceptor 12 is highly thermally responsive and is mounted on supports 13 so that susceptor 12 (and the substrate supported on the upper surface of susceptor 12) can be controllably moved between a lower loading/off-loading position and an upper processing position 14 which is closely adjacent to manifold 11. A center board (not shown) includes sensors for providing information on the position of the substrate.

When susceptor 12 and the substrate are in processing position 14, they are surrounded by a baffle plate 17 having a plurality of spaced holes 23 which exhaust into an annular vacuum manifold 24. Deposition and carrier gases are supplied through supply lines 18 into a mixing system 19, where they are combined and then sent to manifold 11. Generally, supply lines 18 for each of the process gases include (I) safety shut-off valves (not shown) that can be used to automatically or manually shut off the flow of process gas into the chamber, and (ii) mass flow controllers 20 that measure the flow of gas or liquid through the supply lines. When toxic gases are used in the process, the several safety shut-off valves are positioned on each gas supply line in conventional configurations. The rate at which deposition and carrier gases are supplied to gas mixing system 19 is controlled by liquid or gas mass flow controllers 20 and/or by valves. During processing, gas supplied to manifold 11 is vented toward and uniformly distributed radially across the surface of the substrate in a laminar flow as indicated by arrow 21. An exhaust system then exhausts the gas via ports 23 into the circular vacuum manifold 24 and out an exhaust line 31 by a vacuum pump system (not shown). The rate at which gases are released through exhaust line 31 is controlled by a throttle valve 32.

The deposition process performed in CVD system 10 can be either a thermal process or a plasma-enhanced process. In a plasma process, a controlled plasma is formed adjacent to the substrate by RF energy applied to manifold 11 from RF power supply 25. Manifold 11 is also an RF electrode, while susceptor 12 is grounded. RF power supply 25 can supply either single or mixed frequency RF power (or other desired variation) to manifold 11 to enhance the decomposition of reactive species introduced into chamber 15. The mixed frequency RF power is generated by a high frequency RF generator 40 (RF1) and corresponding match circuit 42 and a low frequency RF generator 44 (RF2) and corresponding match circuit 46. A high frequency filter 48 prevents voltage generated by high frequency generator 40 from damaging the low frequency generator.

Heat is distributed by an external lamp module 26. External lamp heater module 26 provides a collimated annular pattern of light 27 through a quartz window 28 onto an annular outer peripheral portion of susceptor 12. Such heat distribution compensates for the natural heat loss pattern of the susceptor and provides rapid thermal and uniform susceptor and substrate heating for effecting deposition. Alternatively, vapor deposition apparatus 10 may include a resistively heated support platen (not shown) for heating the wafer within chamber 15. A description of a suitable resistively heated susceptor can be found in U.S. Pat. application Ser. No. Unassigned, filed Nov. 13, 1996, titled "SYSTEMS AND METHODS FOR HIGH TEMPERATURE PROCESSING OF SEMICONDUCTOR WAFERS" (attorney docket AM1680/T15900), the complete disclosure of which is incorporated herein by reference.

Typically, any or all of the chamber lining, gas distribution manifold faceplate, supports 13, and various other reactor hardware is made out of material such as aluminum, anodized aluminum, or a ceramic material such as aluminum oxide or aluminum nitride. An example of such a CVD apparatus is described in U.S. Pat. No. 5,000,113 entitled "Thermal CVD/PECVD Reactor and Use for Thermal Chemical Vapor Deposition of Silicon Dioxide and In situ Multi-step Planarized Process," issued to Chang et al. and assigned to Applied Materials, Inc., the assignee of the present invention, which is incorporated herein by reference for all purposes.

A motor (not shown) raises and lowers susceptor 12 between a processing position 14 and a lower, substrate-loading position. Motors and optical sensors are used to move and determine the position of movable mechanical assemblies such as throttle valve 32 and susceptor 12. The heater, motors, valves or flow controllers 20 connected to supply lines 18, gas delivery system, throttle valve 32, RF power supply 25, and lamp magnet drivers are all controlled by a system controller 34 over control lines 36 of which only some are shown.

System controller 34 controls all of the activities of the CVD machine. The system controller executes system control software, which is a computer program stored in a computer-readable medium such as a memory 38. Preferably, memory 38 may be a hard disk drive, but memory 38 may also be other kinds of memory. The computer program includes sets of instructions that dictate the timing, mixture of gases, chamber pressure, chamber temperature, RF power levels, susceptor position, and other parameters of a particular process. Of course, other computer programs such as one stored on another memory device including, for example, a floppy disk or other another appropriate drive, may also be used to operate processor 34.

In a preferred embodiment, the system controller includes a hard disk drive (memory 38), a floppy disk drive and a card rack. The card rack contains a single board computer (SBC) processor 37, analog and digital input/output boards, interface boards and stepper motor controller boards. Various parts of CVD system 10 conform to the Versa Modular European (VME) standard which defines board, card cage, and connector dimensions and types. The VME standard also defines the bus structure having a 16-bit data bus and 24-bit address bus.

Figure 1B:
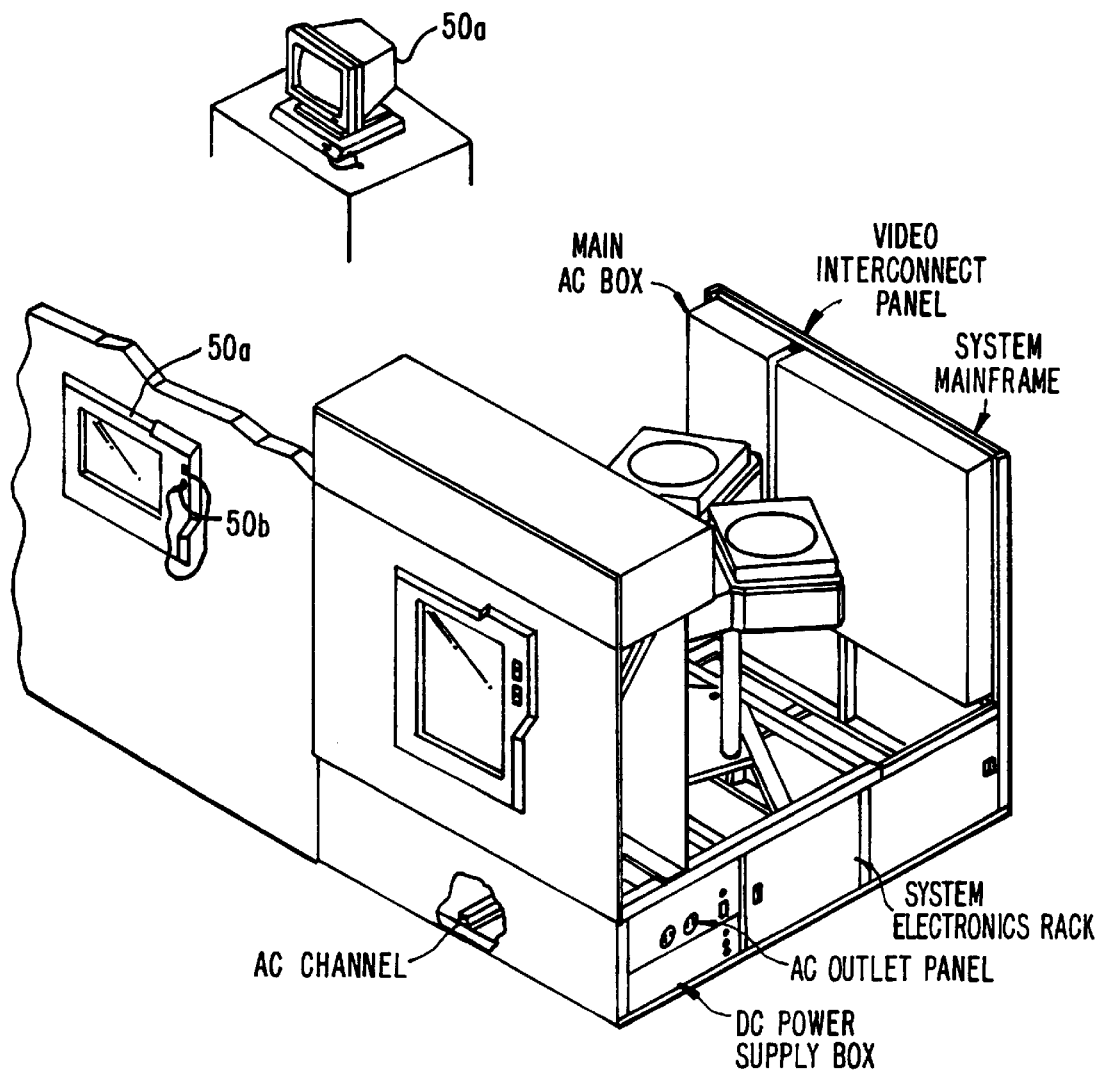
FIG. 1B is a diagram of a system monitor and CVD system in a multi-chamber system, which may include one or more chambers.

The interface between a user and processor 34 is via a CRT monitor 50a and lightpen 50b (shown in FIG. 1B) which is a simplified diagram of the system monitor and CVD apparatus 10 in a multi-chamber system, which may include one or more chambers. CVD apparatus 10 is preferably attached to a mainframe unit (not shown) which contains and provides electrical, plumbing and other support functions for the apparatus 10. Exemplary mainframe units compatible with the illustrative embodiment of CVD apparatus 10 are currently commercially available as the Precision 5000™ and the Centura 5200™ systems from Applied Materials, Inc. of Santa Clara, Calif. The multichamber system has the capability to transfer a wafer between its chambers without breaking the vacuum and without having to expose the wafer to moisture or other contaminants outside the multichamber system. An advantage of the multichamber system is that different chambers in the multichamber system may be used for different purposes in the entire process. For example, one chamber may be used for deposition of oxides, another may be used for rapid thermal processing, and yet another may be used for oxide cleaning. The process may proceed uninterrupted within the multichamber system, thereby preventing contamination of wafers that often occurs when transferring wafers between various separate individual chambers (not in a multichamber system) for different parts of a process.

In the preferred embodiment, two monitors 50a are used, one mounted in the clean room wall for the operators and the other behind the wall for the service technicians. Both monitors 50a simultaneously display the same information, but only one lightpen 50b is enabled. The lightpen 50b detects light emitted by CRT display with a light sensor in the tip of the pen. To select a particular screen or function, the operator touches a designated area of the display screen and pushes the button on the pen 50b. The touched area changes its highlighted color, or a new menu or screen is displayed, confirming communication between the lightpen and the display screen. Of course, other input devices, such as a keyboard, mouse, or other pointing or communication device, may be used instead of or in addition to lightpen 50b to allow the user to communicate with processor 34.

The process for depositing a film onto a substrate can be implemented using a computer program product that is executed by processor 34. The computer program code can be written in any conventional computer readable programming language, such as, 68000 assembly language, C, C++, Pascal, Fortran, or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 1C:
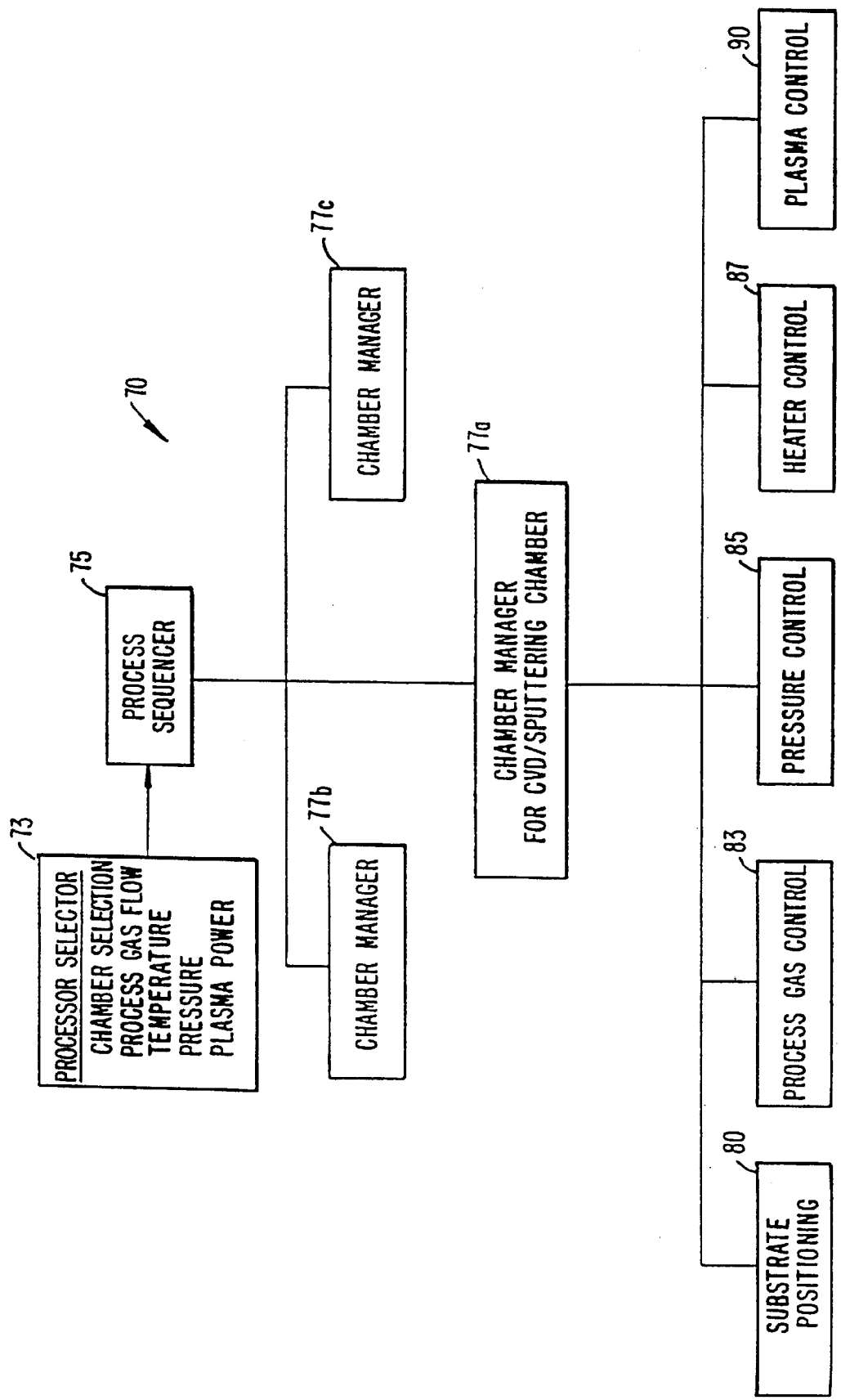
FIG. 1C shows an illustrative block diagram of the hierarchical control structure of the system control software, computer program, according to a specific embodiment.

FIG. 1C shows an illustrative block diagram of the hierarchical control structure of the system control software, computer program 70, according to a specific embodiment. A user enters a process set number and process chamber number into a process selector subroutine 73 in response to menus or screens displayed on the CRT monitor by using the lightpen interface. The process sets are predetermined sets of process parameters necessary to carry out specified processes, and are identified by predefined set numbers. The process selector subroutine 73 identifies (I) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature and are provided to the user in the form of a recipe. The parameters specified by the process recipe are entered utilizing the lightpen/CRT monitor interface. The signals for monitoring the process are provided by the analog input and digital input boards of the system controller, and the signals for controlling the process are output on the analog output and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably the sequencer subroutine 75 includes a program code to perform the steps of (I) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When the user schedules which process is to be executed, the sequencer subroutine 75 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination should be executed next, the sequencer subroutine 75 executes the process set by passing the particular process set parameters to a chamber manager subroutine 77a–c which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines which control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art would readily recognize that other chamber control subroutines can be included depending on what processes are desired to be performed in the process chamber 15. In operation, the chamber manager subroutine 77a selectively schedules or calls the process component subroutines in accordance with the particular process set being executed. The chamber manager subroutine 77a schedules the process component subroutines similarly to how the sequencer subroutine 75 schedules which process chamber 15 and process set is to be executed next. Typically, the chamber manager subroutine 77a includes steps of monitoring the various chamber components, determining which components needs to be operated based on the process parameters for the process set to be executed, and causing execution of a chamber component subroutine responsive to the monitoring and determining steps.

Operation of particular chamber component subroutines will now be described with reference to FIG. 1C. The substrate positioning subroutine 80 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of the susceptor in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives process parameters related to the desired gas flow rates from the chamber manager subroutine. Typically, the process gas control subroutine 83 operates by opening the gas supply lines, and repeatedly (I) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates, and activating the safety shut-off valves when an unsafe condition is detected.

In some processes, an inert gas such as argon is directed into the chamber 15 to stabilize the pressure in the chamber before reactive process gases are introduced into the chamber. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, such as tetraethoxysilane (TEOS), the process gas control subroutine 83 would be written to include steps for bubbling a delivery gas, such as helium, through the liquid precursor in a bubbler assembly or introducing a carrier gas, such as helium, to a liquid injection system. When a bubbler is used for this type of process, the process gas control subroutine 83 regulates the flow of the delivery gas, the pressure in the bubbler, and the bubbler temperature in order to obtain the desired process gas flow rates. As discussed above, the desired process gas flow rates are transferred to the process gas control subroutine 83 as process parameters. Furthermore, the process gas control subroutine 83 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure nanometers connected to the chamber, comparing the measure value(s) to the target pressure, obtaining PID (proportional, integral, and differential) values from a stored pressure table corresponding to the target pressure, and adjusting the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the temperature of the lamp module that is used to heat the substrate. The heater control subroutine 87 is also invoked by the chamber manager subroutine 77a and receives a target, or setpoint, temperature parameter. The heater control subroutine 87 measures the temperature by measuring voltage output of a thermocouple located in a susceptor 12, compares the measured temperature to the setpoint temperature, and increases or decreases current applied to the lamp module 26 to obtain the setpoint temperature. The temperature is obtained from the measured voltage by looking up the corresponding temperature in a stored conversion table, or by calculating the temperature using a fourth order polynomial. When radiant lamps are used to heat the susceptor 12, the heater control subroutine 87 gradually controls a ramp up/down of current applied to the lamp. The gradual ramp up/down increases the life and reliability of the lamp. Additionally, a built-in fail-safe mode can be included to detect process safety compliance, and can shut down operation of the lamp module 26 if the process chamber 15 is not properly set up.

The plasma control subroutine 90 comprises program code for setting the low and high frequency RF power levels applied to the process electrodes in the chamber 15, and to set the low frequency RF frequency employed. Similar to the previously described chamber component subroutines, the plasma control subroutine 90 is invoked by the chamber manager subroutine 77a.

The above description is mainly for illustrative purposes and should not be considered as limiting the scope of the present invention. Variations of the above described system such as variations in supporter design, heater design, location of RF power connections and other variations are possible. For example, the substrate could be supported and heated by a resistively heated platen. Additionally, other plasma CVD equipment such as electron cyclotron resonance (ECR) plasma CVD equipment, induction-coupled RF high density plasma CVD equipment, or the like may be employed. The cleaning of a process chamber in a substrate processing system according to the present invention is not limited to any specific apparatus or to any specific plasma excitation method.

II. Removing Processing Chamber Residues by the Method of the Present Invention

Silicon-based residues are often formed on the interior surfaces of a processing chamber and its components during substrate processing operations, such as deposition and etching. These surfaces may be cleaned according to the method of the present invention by forming a plasma from cleaning process gases introduced into the processing chamber. This plasma reacts with the silicon-based residues to form gases that may be removed from the chamber's interior. The method of the present invention also avoids the formation of polymer residues. As an added benefit, the aluminum fluoride residue often formed during such cleaning processes is reduced or eliminated by this method.

Figure 2:
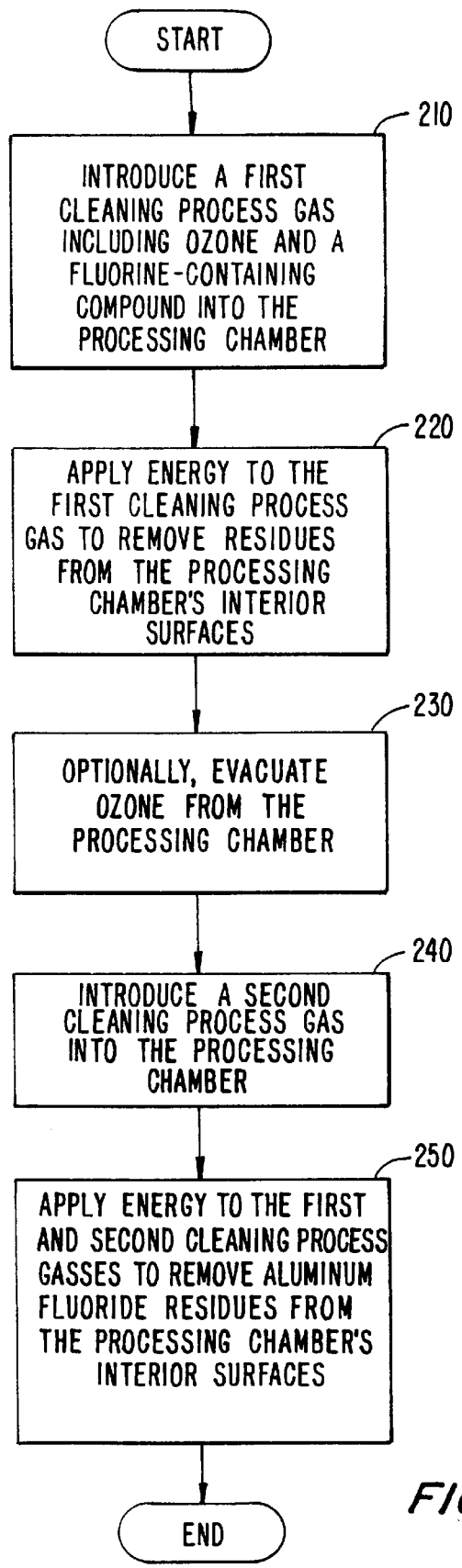
FIG. 2 is a flow diagram for the process of cleaning a processing chamber according to the method of the present invention.

In a preferred embodiment, the method of the present invention employs the two-phase cleaning process illustrated in FIG. 2. The flow diagram of FIG. 2 is described in terms of the exemplary PECVD system shown in FIG. 1A. The process begins at step 210, where a first cleaning process gas is introduced via manifold 11 into vacuum chamber 15 of PECVD system 10. This first cleaning process gas includes a fluorine-containing compound such as nitrogen trifluoride ($NF_3$), dicarbon hexafluoride ($C_2F_6$), carbon tetrafluoride ($CF_4$), or the like. The first cleaning process gas also includes ozone ($O_3$) or a mixture of oxygen and ozone. Preferably, a mixture of oxygen and ozone is used. The ozone content of this mixture is usually between about 5% and 15% by weight, and is preferably between about 8% and 13% by weight. The ratio of oxygen to ozone is between about 20:1 and 6.7:1, and is preferably between about 12.5:1 and 7.7:1.

RF power supply 25 supplies RF energy to form a controlled plasma from the first cleaning process gas to remove residues from the interior surfaces of vacuum chamber 15 at step 220. RF power supply 25 supplies a high frequency (typically up to 20 MHz) power ranging from about 500 Watts and 2000 Watts to manifold 11. Preferably, RF power supply 25 is configured to supply about 1500 Watts of RF power to the manifold. In the exemplary PECVD system previously described, the power density used ranges between about 0.99 Watts/cm$^2$ and 3.95 Watts/cm$^2$, but is preferably about 2.96 Watts/cm$^2$. These values are for a system having a 10-inch diameter faceplate.

As a result of the reaction between the ozone and fluorine-containing compounds, a large number of fluorine radicals are liberated. These fluorine radicals react with the silicon-based residues formed during substrate processing operations such as deposition and etching. Additionally, the ozone in the first cleaning process gas reacts with the polymers which often accumulate during such operations. This phase of the procedure substantially removes the residues formed during substrate processing. This is done, depending on the cleaning gas used, according to the following formulae:

$$2\ O_3 + 3\ NF_3 \rightarrow 3\ NO_2 + 9\ F$$

$$4\ O_3 + 4\ C_2F_6 \rightarrow 6\ CO_2 + C_2F_4 + 20\ F^*$$

The fluorine so liberated is then free to react with silicon oxide residues existing on the processing chamber's interior surfaces. For example, fluorine will react with a silicon dioxide residue in the following manner:

$$SiO_2 + 4\ F \rightarrow SiF_4 + O_2$$

The energized cleaning gases react with the material to be removed, forming gaseous by-products which are then evacuated from the processing chamber by the exhaust system. However, because the SiO$_2$ residues do not accumulate equally about the interior of the processing chamber, the fluorine which removes the silicon-based residues continues to react with the interior surfaces of the chamber and the chamber's components. Since many of these surfaces are aluminum, an aluminum fluoride residue may be formed thereon.

After a substantial portion of the deposition residue has reacted with the cleaning gas, the ozone is evacuated from vacuum chamber 15 at step 230. The ozone is removed to avoid interference with the reactions which occur in subsequent processing steps. During this operation, system controller 34 causes RF power supply 25 to maintain the plasma generated in step 220. At step 240, a second cleaning process gas is introduced into vacuum chamber 15. This second cleaning process gas may include compounds such as C$_2$F$_6$ or nitrogen (N$_2$). These compounds promote a reaction between the plasma and any aluminum fluoride (AlF) which may have been formed during the previous cleaning phase (i.e., step 220). If the ozone had not been removed in step 230, these compounds would react preferentially with the ozone and not with the fluorine in the aluminum fluoride. At step 250 the substrate processing system maintains the plasma to substantially remove aluminum fluoride residues which may have formed on interior surfaces of vacuum chamber 15 during step 220. Additionally, this step is believed to passivate the processing chamber's interior, reducing the rate at which aluminum fluoride accumulates.

In a specific embodiment, the method of the present invention includes NF$_3$ and O$_3$ in the first cleaning process gas and C$_2$F$_6$ in the second cleaning process gas. Again, ozone will preferably be introduced in a mixture with oxygen, in the percentages previously described. NF$_3$ may be introduced into vacuum chamber 15 at a rate of between about 100 sccm and 500 sccm, but is preferably introduced at a rate of less than about 300 sccm. O$_3$ may be introduced into vacuum chamber 15 at a rate of between about 1500 sccm and 2500 sccm, but is preferably introduced at a rate of about 2000 sccm. C$_2$F$_6$ may be introduced into vacuum chamber 15 at a rate of between about 450 sccm and 750 sccm, but is preferably introduced at a rate of about 600 sccm. Alternatively, the second cleaning process gas may include N$_2$. If used, N$_2$ may be introduced into vacuum chamber 15 at a rate of between about 2500 sccm and 3000 sccm, but is preferably introduced at a rate of about 2750 sccm.

In another embodiment, the method of the present invention includes C$_2$F$_6$ and O$_3$ in the first cleaning process gas. In this embodiment, C$_2$F$_6$ also serves as the second cleaning process gas. C$_2$F$_6$ may be introduced into vacuum chamber 15 at a rate of between about 450 sccm and 750 sccm, but is preferably introduced at a rate of about 600 sccm. This is the flow rate for C$_2$F$_6$ in both the first and second cleaning process gases. O$_3$ may be introduced into vacuum chamber 15 at a rate of between about 1500 sccm and 2500 sccm, but is preferably introduced at a rate of about 2000 sccm.

If C$_2$F$_6$ is included in the second cleaning process gas, the RF power is preferably reduced during the second cleaning phase (step 250 in FIG. 2). Normally, RF power supply 25 supplies RF power at between about 500 Watts and 2000 Watts. When C$_2$F$_6$ is used, RF power levels are preferably set to between about 500 Watts and 700 Watts. At these higher RF power levels, which are necessary to achieve the dissociation of C$_2$F$_6$, the C$_2$F$_6$ effectively removes the silicon-based residues which may form on the interior of vacuum chamber 15. Unfortunately, at such elevated power levels, C$_2$F$_6$ also tends to form an aluminum fluoride residue when it comes into contact with the surfaces of aluminum processing chamber components. Reduced RF power levels in conjunction with the use of C$_2$F$_6$ permit the removal of aluminum fluoride deposits. Due to the reduced RF power levels employed and the attendant reduction in reactivity, these levels do not permit the efficient removal of silicon-based residues. This reduction in reactivity also avoids the generation of residual aluminum fluoride. However, the reduced reactivity of C$_2$F$_6$ in the second cleaning step is still great enough to remove a portion of any aluminum fluoride residues which may have formed in the preceding cleaning step.

When C$_2$F$_6$ is used, system controller 34 is programmed to set the output of RF power supply 25 to between about 400 Watts and 600 Watts, and preferably about 500 Watts. In a substrate processing system equipped with a 10-inch diameter faceplate, such as the exemplary PECVD system previously described, the power density used ranges between about 0.79 Watts/cm$^2$ and 1.19 Watts/cm$^2$, but is preferably about 0.99 Watts/cm$^2$. Alternatively, N$_2$ may be used as the third cleaning process gas. If used, N$_2$ may be introduced into vacuum chamber 15 at a rate of between about 2500 sccm and 3000 sccm, but is preferably introduced at a rate of about 2750 sccm. No alteration in RF power is required during the second cleaning step in embodiments using N$_2$. As before, after the energized cleaning gases react with the aluminum fluoride, the gaseous by-products formed are evacuated from the processing chamber.

In the preceding embodiments, the temperature inside vacuum chamber 15 is preferably kept between about 350–500° C. and chamber pressure is maintained at between about 100 torr and 700 torr. In one embodiment, chamber pressure is usually about 250 torr. In another embodiment, chamber pressure is usually about 450 torr. The process parameters, plasma densities and gas introduction rates described herein are representative values for a lamp-heated DCVD Silane Chamber manufactured by Applied Materials, Inc., outfitted to process 10-inch substrates. The flow rates discussed above may differ with chambers of other design and volume.

While the above is a full description of the specific embodiments, various modifications, alternative constructions and equivalents may be used. For example, while the description above is in terms of a PECVD system for a multi-chamber substrate processing system, it would be possible to implement the present invention with other plasma etching chambers, or the like. Therefore, the above description and illustrations should not be taken as limiting the scope of the present invention defined by the appended claims. In addition, it should be further noted that the invention is not limited to a single substrate processing chamber as described above and shown in certain of the enclosed drawings. For example, a process according to the method of the present invention could be carried out in a batch chamber that simultaneously processes a plurality of substrates. In addition, the invention would be suitable for use in a multi-substrate processing chamber that sequentially performs individual processing steps on each of the substrates.

What is claimed is:

1. A substrate processing system comprising:
   a housing defining a chamber;
   a gas distribution system adapted to introduce one or more gases into said chamber;
   a plasma generation system operatively coupled to form a plasma within said chamber;
   a controller for controlling said gas distribution system and said plasma generation system; and
   a memory coupled to said controller comprising a computer readable medium having a computer readable program embodied therein for directing operation of said substrate processing system, said computer readable program comprising:
      computer instructions that control said gas distribution system to flow a first cleaning process gas into said chamber, said first cleaning process gas comprising ozone and a fluorine-containing compound;
      computer instructions that control said plasma generation system to form a plasma from said first cleaning process gas and maintain said plasma for a first time period;
      computer instructions that control said gas distribution system to flow, after flowing said first cleaning process gas, a second cleaning process gas into said chamber, said second cleaning process gas comprising a compound selected from the group consisting of perfluorocarbons, fluorine, nitrogen, and combinations of fluorine and nitrogen; and
      computer instructions that control said plasma generation system to form a plasma from said second cleaning process gas and maintain said plasma for a second time period.

2. The substrate processing system of claim 1, wherein:
   said computer instructions that control said plasma generation system apply RF power at a level of between 0.99–3.95 W/cm$^2$ when generating said plasma from said first cleaning process and apply RF power at a level of between about 0.79–3.95 W/cm$^2$ when generating said plasma from said second cleaning process gas.

3. The substrate processing system of claim 2, wherein said second cleaning process gas comprises $C_2F_6$.

4. The substrate processing system of claim 1, wherein:
   said substrate processing system further comprises a pressure control system operatively coupled to maintain a selected pressure within said chamber, said pressure control system being controlled by said controller; and
   wherein said computer readable program further comprises computer instructions that control said pressure control system to evacuate said deposition residue from said processing chamber during said first time period and said cleaning residue during said second time period.

5. The substrate processing system of claim 1, wherein said fluorine-containing compound comprises $NF_3$.

6. The substrate processing system of claim 1, wherein said second cleaning process gas comprises $N_2$.

7. The substrate processing system of claim 1, wherein:
   said substrate processing system further comprises a pressure control system operatively coupled to maintain a selected pressure within said chamber, said pressure control system being controlled by said controller, and
   wherein said computer readable program further comprises computer instructions that control said pressure control system to evacuate said deposition residue from said processing chamber during said first time period and said cleaning residue during said second time period.

8. The substrate processing system of claim 1, wherein said first cleaning process gas comprises a mixture of between about 8% and 13% ozone, by weight, in oxygen.

9. The substrate processing system of claim 1 wherein said first cleaning process gas comprises a mixture of oxygen and ozone, wherein the ratio of oxygen to ozone in said mixture is between about 12.5:1 and 7.7:1.

10. The substrate processing system of claim 1 wherein:
   said computer instructions that control said plasma generation system apply RF power at a level of between 0.99–3.95 W/cm$^2$ when generating said plasma from said first cleaning process and apply RF power at a level of between about 0.79–3.95 W/cm$^2$ when generating said plasma from said second cleaning process gas.

11. A substrate processing system comprising:
   a housing defining a chamber;
   a gas distribution system adapted to introduce one or more gases into said chamber;
   a plasma generation system operatively coupled to form a plasma within said chamber;
   a controller for controlling said gas distribution system and said plasma generation system; and
   a memory coupled to said controller comprising a computer readable medium having a computer readable program embodied therein for directing operation of said substrate processing system, said computer readable program comprising:

computer instructions that control said gas distribution system to flow a first cleaning process gas into said chamber, said first cleaning process gas comprising $C_2F_6$ and ozone;

computer instructions that control said plasma generation system to form a plasma from said first cleaning process gas by applying said RF power at a first RF power density of between about 1.38 W/cm² for a first time period and then reduce said RF power density to between about 0.79 W/cm² and 1.19 W/cm² during a subsequent, second time period.

12. A substrate processing system comprising:

a housing defining a chamber;

a gas distribution system adapted to introduce one or more gases into said chamber;

a plasma generation system operatively coupled to form a plasma within said chamber;

a controller for controlling said gas distribution system and said plasma generation system; and a memory coupled to said controller comprising a computer readable medium having a computer readable program embodied therein for directing operation of said substrate processing system, said computer readable program comprising:

computer instructions that control said gas distribution system to flow a cleaning process gas into said chamber, said cleaning process gas comprising a fluorine-containing compound;

computer instructions that control said plasma generation system to form a plasma from said first cleaning process gas by applying said RF power at a first RF power density of between about 1.38 W/cm² and 3.95 W/cm² for a first time period and then reduce said RF power density to between about 0.79 W/cm² and 1.19 W/cm² during a subsequent, second time period.

13. The substrate processing system of claim 12 wherein said computer program further includes computer instructions that control said gas distribution system to alter the composition of said cleaning process gas after said first time period by discontinuing a flow of said fluorine-containing source and commencing a flow of different fluorine-containing compound.

14. The substrate processing system of claim 13 wherein fluorine-containing compound comprises $C_2F_6$.

15. The substrate processing system of claim 12 wherein said cleaning process gas further comprises ozone and said computer program further includes computer instructions that control said gas distribution system to alter the composition of said cleaning process gas after said first time period by discontinuing the flow of said ozone.

* * * * *